United States Patent
Kimura

[19]

[11] Patent Number: 6,107,828
[45] Date of Patent: Aug. 22, 2000

[54] PROGRAMMABLE BUFFER CIRCUIT AND A MASK ROM DEVICE HAVING THE SAME

[75] Inventor: Takemi Kimura, Tokyo, Japan

[73] Assignee: NEC Corporation, Tokyo, Japan

[21] Appl. No.: 09/109,092

[22] Filed: Jul. 2, 1998

[30] Foreign Application Priority Data

Jul. 3, 1997 [JP] Japan ................................. 9-177939

[51] Int. Cl.[7] .................................................. G06F 7/38
[52] U.S. Cl. ................... 326/49; 326/87; 326/57
[58] Field of Search .................................. 326/44, 45, 37, 326/49, 50, 59, 56, 57, 58, 52, 54, 55, 87, 112, 119, 121

[56] References Cited

U.S. PATENT DOCUMENTS

| | | | |
|---|---|---|---|
| 4,612,459 | 9/1986 | Pollachek | 307/468 |
| 4,823,309 | 4/1989 | Kusaka et al. | 364/900 |
| 5,751,165 | 5/1998 | Yoeli et al. | 326/47 |

FOREIGN PATENT DOCUMENTS 61-9017  1/1986  Japan .

*Primary Examiner*—Michael Tokar
*Assistant Examiner*—A. Tran
*Attorney, Agent, or Firm*—Foley & Lardner

[57] ABSTRACT

A programmable buffer circuit comprises a logical gate circuit having a second input terminal, a third input terminal and a first output terminal, and a first input terminal. The second input terminal is connected to the first input terminal. Further, a selective signal generating circuit for supplying two kinds of selective signals in logical level to the third input terminal is provided. A tri-state inverter circuit having a fourth input terminal and a second output terminal is provided and a tri-state buffer circuit having a fifth input terminal and a third output terminal is provided. The fourth input terminal and the fifth input terminal are connected to the first output terminal. A fourth output terminal is connected to the second output terminal and the third output terminal.

7 Claims, 4 Drawing Sheets

PROGRAMMABLE BUFFER CIRCUIT AND A MASK ROM DEVICE HAVING THE SAME

BACKGROUND OF THE INVENTION

1. Field of the Invention

The present invention relates to a programmable buffer circuit for receiving a control signal, which is preferable for application to a semiconductor device such as a semiconductor memory or the like, and more particularly to a programmable buffer circuit enabling high density integration and a mask ROM device having the same.

2. Description of the Related Art

Generally, various kinds of plural signal pins are provided on a semiconductor device such as a microprocessor, a dynamic random access memory (DRAM), a mask ROM and the like to output a signal out of the same devices and input a signal from outside thereof. A control signal pin for receiving a control signal is enumerated as the signal pin as well as a pin for data input/output and a pin for address input/output. Selecting whether a semiconductor device provided with such a control signal pin is in activated state or non-activated state, selecting an operation of the semiconductor device and the like are carried out by a control signal supplied to the control signal pins. For example, the above-mentioned mask ROM usually contains a chip-enable terminal (CE terminal). Whether the chip is to be activated or not activated can be controlled according to a chip-enable signal (CE signal) supplied to a CE terminal from outside of the chip. That is, when the chip is of low active type, if the CE signal is low level, the chip is activated. If the signal is high level, the chip is in not activated state. Further, when the chip is of high active type, if the CE signal is high level, the chip is activated and if the signal is low level, the chip is in not activated state.

However, whether the chip is of low active type or high active type is usually selected according to user's request. If a manufacturer intends to produce both a low active type product and a high active type product to meet such a customer's request, the product line is diversified. As a result, the production cost increases. Therefore, this countermeasure is not preferable in economic viewpoints.

From this viewpoint, such a technology which enables adaptation of a chip to both low active type and high active type by providing a programmable buffer circuit inside the chip and introducing a program into the circuit has been proposed (Japanese Unexamined Patent Publication No. Sho 61-9017).

FIG. 1 is a circuit diagram showing a conventional programmable buffer circuit. An external CE terminal 50 to which a CE signal is to be supplied from outside and an internal CE terminal 51 to be connected to an internal circuit such as a memory cell array, a control circuit or the like are provided in a conventional programmable buffer circuit. Further, a NOR circuit 52 and an exclusive OR circuit 53 are connected in series from the external CE terminal 50 in this order between the external CE terminal 50 and the internal CE terminal 51.

The external CE terminal 50 is connected to one input terminal of the NOR circuit 52 and a selective signal generating circuit 54 is connected to the other input terminal of the NOR circuit 52. Further, the output terminal of the NOR circuit 52 is connected to one input terminal of the exclusive OR circuit 53 and the selective signal generating circuit 55 is connected to the other input terminal of the exclusive OR circuit 53.

In each of the selective signal generating circuits 54 and 55, two switches are connected in series between a power supply and ground. One input terminal of the NOR circuit 52 and one input terminal of the exclusive OR circuit 53 are each connected to a connection point between these switches. The logical level of the selective signal which is transmitted from the selective signal generating circuits 54 or 55 to the input terminal of the NOR circuit 52 or the exclusive OR circuit 53 is determined by the switches provided in the selective signal generating circuits 54 or 55. Because the logical level thereof is selected by user, conduction or non-conduction of the switch is determined by selection of the user.

Next, an operation of the conventional programmable buffer circuit having such a structure will be described.

Assume that a low active type semiconductor memory is used as an internal circuit connected to the internal CE terminal 51. That is, when the internal CE terminal 51 is set in low level, the semiconductor memory is activated.

When the semiconductor memory is of low active type, if the user's request is low active type, only the grounding side switch of the selective signal generating circuit 54 is made conductive, and only the power supply side switch of the selective signal generating circuit 55 is made conductive. As a result, a selective signal transmitted from the selective signal generating circuit 54 becomes of low level and a selective signal transmitted from the selective signal generating circuit 55 becomes of high level. Then, the logical level of a signal to be transmitted to the internal CE terminal 51 becomes of the same phase as a signal supplied to the external CE terminal 50. Thus, the programmable buffer circuit becomes low active type, so that the user's request is satisfied.

On the other hand, if the user's request is high active type, only the grounding side switches of the selective signal generating circuits 54 and 55 are made conductive. As a result, both selective signals transmitted from the selective signal generating circuits 54 and 55 become of low level. The logical level of a signal transmitted to the internal CE terminal 51 becomes of the opposite phase to a signal supplied to the external CE terminal 50. Thus, the programmable buffer circuit becomes high active type, so that the user's request is satisfied.

If the user's request is "don't care" type or a type of active irrespective of the logical level of a signal supplied to the external CE terminal 50, only the power supply side switch of the selective signal generating circuit 54 is made conductive, while only the grounding side switch of the selective signal generating circuit 55 is made conductive. As a result, a selective signal transmitted from the selective signal generating circuit 54 becomes of high level and a selective signal transmitted from the selective signal generating circuit 55 becomes of low level. Then, the logical level of a signal transmitted to the internal CE terminal 51 is low level irrespective of a signal supplied to the external CE terminal 50. Thus, the programmable buffer circuit becomes "don't care" type, so that the user's request is satisfied.

However, the above-mentioned conventional programmable buffer circuit requires relatively many devices and most chip area is occupied by the programmable buffer circuit.

That is, the programmable buffer circuit shown in FIG. 1 requires the NOR circuit 52 and the exclusive OR circuit 53, and the NOR circuit 52 and the exclusive OR circuit 53 are constituted of many devices. FIG. 2 is a circuit diagram indicating a NOR circuit on transistor level, and FIG. 3 is a circuit diagram indicating an exclusive OR circuit on transistor level. As shown in FIG. 2, a NOR circuit is constituted of four transistors on transistor level. Further, as shown in FIG. 3, an exclusive OR circuit is constituted of 14 transistors on transistor level.

Therefore, as shown in FIGS. 1–3, totally 18 transistors are needed in the conventional programmable buffer circuit. Further, the switch elements for constituting the selective signal generating circuits 54 and 55 are also needed. Thus, an area on which these components are formed is relatively large.

SUMMARY OF THE INVENTION

Accordingly, an object of the present invention is to provide a programmable buffer circuit which enables chip high integration by reducing occupied area and a mask ROM device having the same.

A programmable buffer circuit according to the present invention contains a first input terminal and a logical gate circuit. The logical gate circuit has a second input terminal, a third input terminal and a first output terminal. The second input terminal is connected to the first input terminal. Further, the programmable buffer circuit has a selective signal generating circuit for supplying two kinds of selective signals in logical level to the third input terminal, a tri-state inverter circuit and a tri-state buffer circuit. The tri-state inverter circuit has a fourth input terminal connected to the first output terminal, and a second output terminal. The tri-state buffer circuit has a fifth input terminal connected to the first output terminal, and a third output terminal. Furthermore, the programmable buffer circuit has a fourth output terminal connected to the second output terminal and the third output terminal.

According to the present invention, the programmable buffer circuits are constituted of as few devices as possible, an area occupied by the programmable buffer circuit on a chip is reduced so that chip high integration is intensified.

A mask ROM device according to the present invention contains the programmable buffer circuit and an internal circuit connected to the programmable buffer circuit. This programmable buffer circuit is the same as mentioned above except that a terminal connected to the second output terminal and third output terminal is an internal terminal. Activated state or not activated state of the internal circuit is changed over depending on the logical level of a signal transmitted to the internal terminals.

According to the present invention, high integration is enabled because the aforementioned programmable buffer circuit is incorporated.

DETAILED DESCRIPTION OF THE PREFERRED EMBODIMENTS

Figure 4:
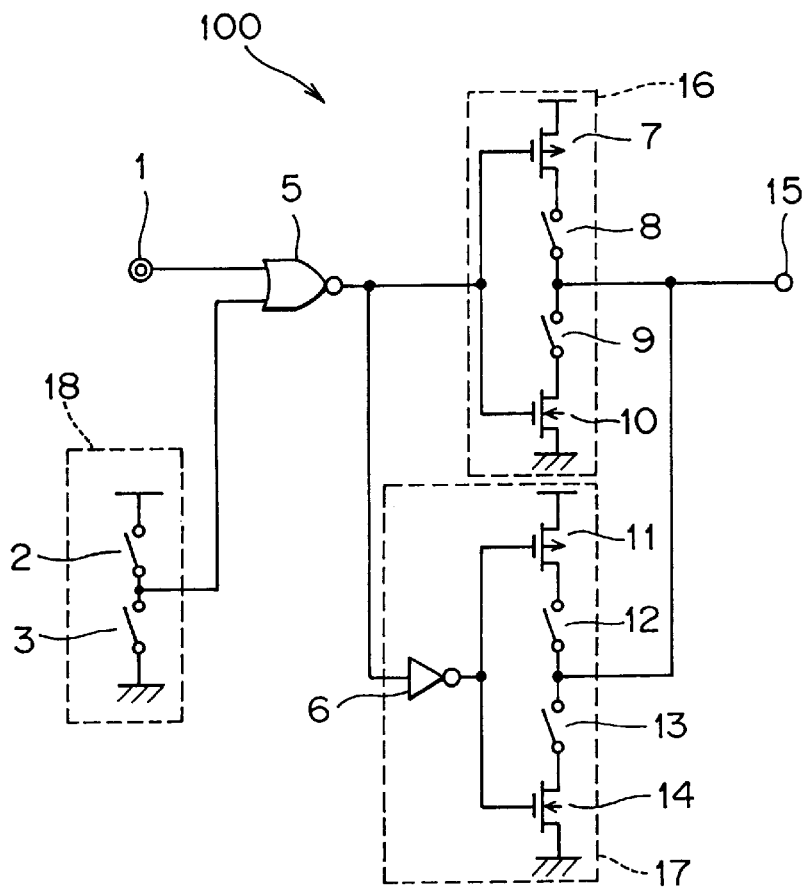
FIG. 4 is a circuit diagram showing a programmable buffer circuit according to an embodiment of the present invention.

Hereinafter, embodiments of the present invention will be described with reference to the accompanying drawings. FIG. 4 is a circuit diagram showing a programmable buffer circuit according to an embodiment of the present invention. This embodiment can be applied to various kinds of semiconductor devices such as a microprocessor, a DRAM, a mask ROM and the like.

An external CE terminal 1 to which a CE signal is supplied from outside and an internal CE terminal 15 to be connected to an internal circuit such as a memory cell array, a control circuit or the like are provided in a programmable buffer circuit 100 of this embodiment. Further, a NOR circuit 5 is connected between the external CE terminal 1 and the internal CE terminal 15. A first circuit 16 and a second circuit 17 are connected in parallel to each other between the NOR circuit 5 and the internal CE terminal 15.

A CE signal supplied to the external CE terminal 1 from outside of the chip is inverted corresponding to a request of user and, after that, is transmitted to the internal CE terminal 15. Then, the CE signal transmitted to the internal CE terminal 15 is supplied to the internal circuit of the chip, for example, a timing generator or the like.

The first circuit 16 comprises a P-channel MOS transistor 7, a switch element 8, a switch element 9 and an N-channel MOS transistor 10 which are connected in series between a power supply and ground. The output terminal of the NOR circuit 5 is connected to the gate of the P-channel MOS transistor 7 and the gate of the N-channel MOS transistor 9. A connection point between the switch element 8 and the switch element 9 is connected to the internal CE terminal 15.

On the other hand, the second circuit 17 comprises a P-channel MOS transistor 11, a switch element 12, a switch element 13 and an N-channel MOS transistor 14 which are connected in series between a power supply and ground, and an inverter circuit 6 the output terminal of which is connected to the gate of the P-channel MOS transistor 11 and the gate of the N-channel MOS transistor 14. The input terminal of the inverter circuit 6 is connected to the output terminal of the NOR circuit 5. A connection point between the switch element 12 and the switch element 13 is connected to the internal CE terminal 15.

The external CE terminal 1 is connected to one input terminal of the NOR circuit 5 and a selective signal generating circuit 18 is connected to the other input terminal of the NOR circuit 5. The selective signal generating circuit 18 comprises two switch elements 2 and 3 which are connected in series between a power supply and ground. A connection point between the switch element 2 and the switch element 3 is connected to the input terminal of the NOR circuit 5.

Figure 1:
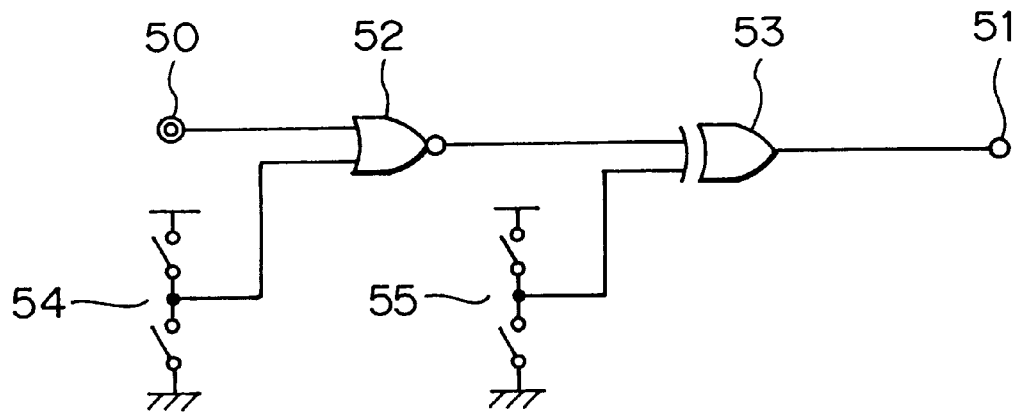
FIG. 1 is a circuit diagram showing a conventional programmable buffer circuit.
Figure 2:
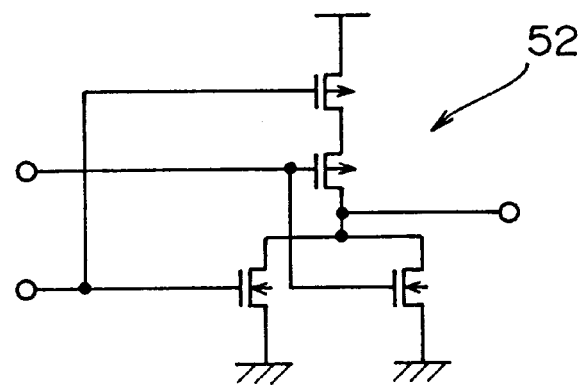
FIG. 2 is a circuit diagram showing a NOR circuit on transistor level.
Figure 3:
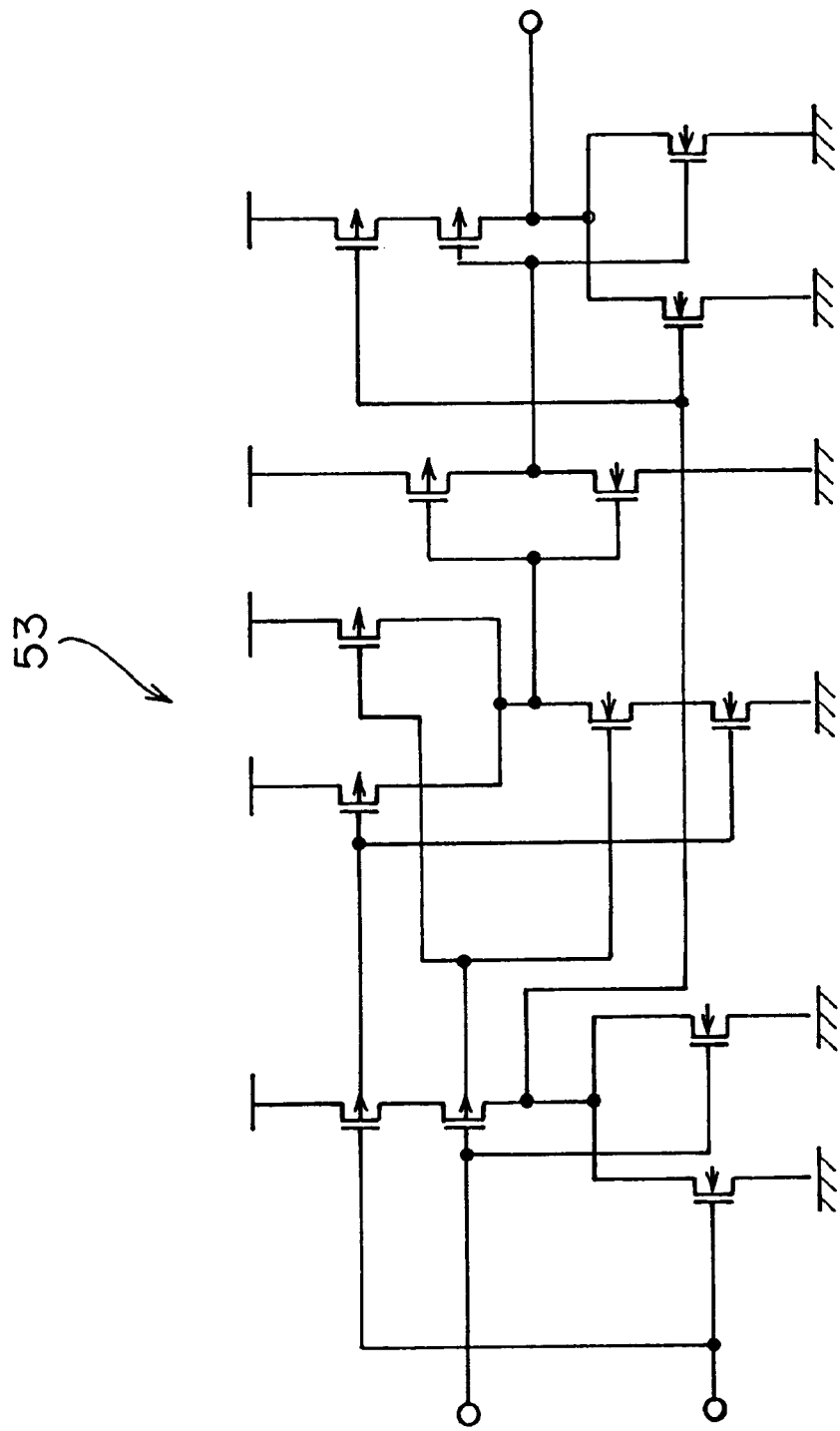
FIG. 3 is a circuit diagram showing an exclusive OR circuit on transistor level.

The NOR circuit 5 is the same as that used in a conventional example as shown in FIG. 2. The inverter circuit 6 contains, for example, two transistors.

Figure 5:
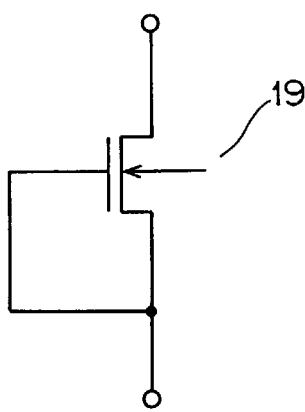
FIG. 5 is a circuit diagram showing an example of switch elements.

The switch element is constituted of, for example, an N-channel MOS transistor in which the gate and the source are short-circuited. FIG. 5 is a circuit diagram showing an example of a switch element. In the N-channel MOS transistor 19 in which the gate and the source are short-circuited, and conduction or non-conduction between the source and the drain is determined depending on an amount of ion injected into the channel region. That is, if the transistor 19 is formed in enhancement type by setting a threshold depending on the amount of ion injection, the transistor 19 is always off because of the short circuit between the gate and the source. Therefore, it functions as a switch element set in the non-conduction state. On the other hand, if the transistor 19 is formed in depletion type by setting of the threshold by ion injection, the transistor 19 is always on because of the short circuit between the gate and the source. Therefore, it functions as a switch element set in conduction state. However, the switch mentioned herein is not restricted to the N-channel MOS transistor. Also, the transistor used as a switch element can be designed smaller than other transistors 7, 10 or the like in size.

Figure 6:
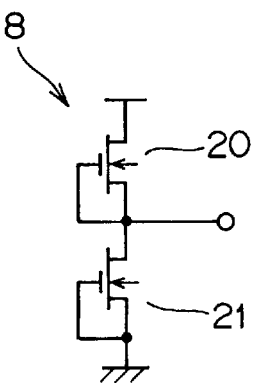
FIG. 6 is a circuit diagram showing an example in which N channel MOS transistors are used as switch elements in a selective signal generating circuit 18.

FIG. 6 is a circuit diagram shows an embodiment in which N-channel MOS transistors are used as switch elements in the selective signal generating circuit 18. In this case, the switch element 2 is composed of an N-channel MOS transistor 20, and the switch element 3 is composed of an N-channel MOS transistor 21.

Next, an operation of the programmable buffer circuit 100 according to the embodiment having the above-described structure will be described. Here assume that a low active type internal circuit is connected to the internal CE terminal 15. Namely, when the internal CE terminal 15 is in low level, the internal circuit is activated. However, the present invention is not restricted to this example, but it is needless to say that the present invention can be applied to a high active type.

Table 1 shows setting of the switch elements corresponding to a request of customer.

TABLE 1

| Customer's request | Signs of switch elements to be made conductive | Input signal (terminal 1) | Output signal (terminal 15) |
|---|---|---|---|
| Low active | 3,8,9 | High | High |
|  |  | Low | Low |
| High active | 3,12,13 | High | Low |
|  |  | Low | High |
| Don't care | 2,(12,)13 | High | Low |
|  |  | Low | Low |

For example, when the internal circuit is of low active type, if a request of customer (user) is low active type (low selection), as shown in Table 1, the switch elements 3, 8 and 9 are made conductive. As a result, a selective signal transmitted from the selective signal generating circuit 18 becomes of low level. Thus, an inversion signal of the external CE terminal 1 is outputted from the NOR circuit 5.

On the other hand, because the switch elements 8 and 9 are in conductive state, the first circuit 16 functions as an inverter circuit. Therefore, the output signal from the NOR circuit 5 is inverted by the first circuit 16. Further, because the switch elements 12 and 13 are both in non-conductive state, a signal transmitted to the internal CE terminal 15 is not affected by the second circuit 17 at all. Therefore, the logical level of a signal to be transmitted to the internal CE terminal 15 is of the same phase as the logical level of the CE signal supplied to the external CE terminal 1. Thus, the programmable buffer circuit 100 is of low active type, so that the user's request is satisfied.

If the customer's (user's) request is high active type (high selection), the switch elements 3, 12 and 13 are made conductive, as shown in Table 1. As a result, a selective signal transmitted from the selective signal generating circuit 18 becomes of low level. Thus, an inverted signal of the external CE terminal 1 is outputted from the NOR circuit 5.

On the other hand, because the switch elements 12 and 13 are in conductive state, the second circuit 17 functions as a buffer circuit. Thus, the output signal from the NOR circuit 5 is not inverted by the second circuit 17. Further, because the switch elements 8 and 9 are both in non-conductive state, a signal transmitted to the internal CE terminal 15 is not affected by the first circuit 16 at all. Therefore, the logical level of the signal transmitted to the internal CE terminal 15 is of the opposite phase to the logical level of the CE signal supplied to the external CE terminal 1. Thus, the programmable buffer circuit 100 acts as high active type, so that the user's request is satisfied.

If the customer's (user's) request is "don't care" type or active type irrespective of the logical level of the signal supplied to the external CE terminal 1, the switch elements 2, 12 and 13 are made conductive as shown in Table 1. Thus, the selective signal transmitted from the selective signal generating circuit 18 becomes of high level. Therefore, the signal to be outputted from the NOR circuit 5 is of low level irrespective of the signal of the external CE terminal 1.

On the other hand, because the switch elements 12 and 13 are in conductive state, the second circuit 17 functions as a buffer circuit. Thus, the output signal from the NOR circuit 5 is not inverted by the second circuit 17. Further, because the switch elements 8 and 9 are both in non-conductive state, the signal transmitted to the internal CE terminal 15 is not affected by the first circuit 16 at all. Therefore, the logical level of the signal transmitted to the internal CE terminal 15 is always of low level irrespective of the signal supplied to the external CE terminal 1. Thus, the programmable buffer circuit 100 acts as "don't care" type, so that the user's request is satisfied.

Meanwhile, if the user's request is "don't care" type, the switch element 12 may be in non-conductive state although the above description says that the switch elements 2, 12 and 13 are in conductive state. This reason is that the transistor 11 is never in conductive state because the output signal of the inverter circuit 6 is always of low level. If the switch element 12 is made conductive when the customer request is "don't care" type also, the conductive state of the switches in the second circuit 17 is equal between the case when the customer's (user's) request is high active type and the case when the user's request is "don't care" type. Therefore, the design of this circuit is facilitated. Further because the second circuit 17 can be regarded as a tri-state buffer circuit, designing with CAD is facilitated. Thus, it is desirable that the switch element 12 is made conductive when the customer's (user's) request is "don't care" type also.

Like the second circuit 17, the first circuit 16 can be regarded as a tri-state inverter circuit.

As described above, according to the present embodiment, the circuit can be adapted to any type even if the user's request is low active type, high active type or "don't care" type only by selecting the switch elements. The programmable buffer circuit 100 contains only ten transistors and six switch elements. Thus, the number of the devices necessary is smaller than the conventional programmable buffer circuit requiring eighteen transistors and four switch elements. Thus, a chip area occupied by the programmable buffer circuit can be reduced thereby making it possible to enhance chip integration. In 10 transistors constituting the programmable buffer circuit 100, four transistors are used for constituting the NOR circuit 5 and two are used for constituting the inverter circuits.

The switch element provided on the programmable buffer circuit according to the present invention is not restricted to the type having a transistor. For example, a type having metallic wiring, preferably having aluminum wiring, a type having a fuse element or the like is also permitted and its kind is not limited to a particular one. In a case when the switch element has a fuse element, a means for switching between conductive state and non-conductive state is not restricted to a particular one. For example, it is permissible to select the conductive state or the non-conductive state by melting the fuse element with a large current or it is permissible to select the conductive state or the non-conductive state by melting it with laser beam.

Figure 7:
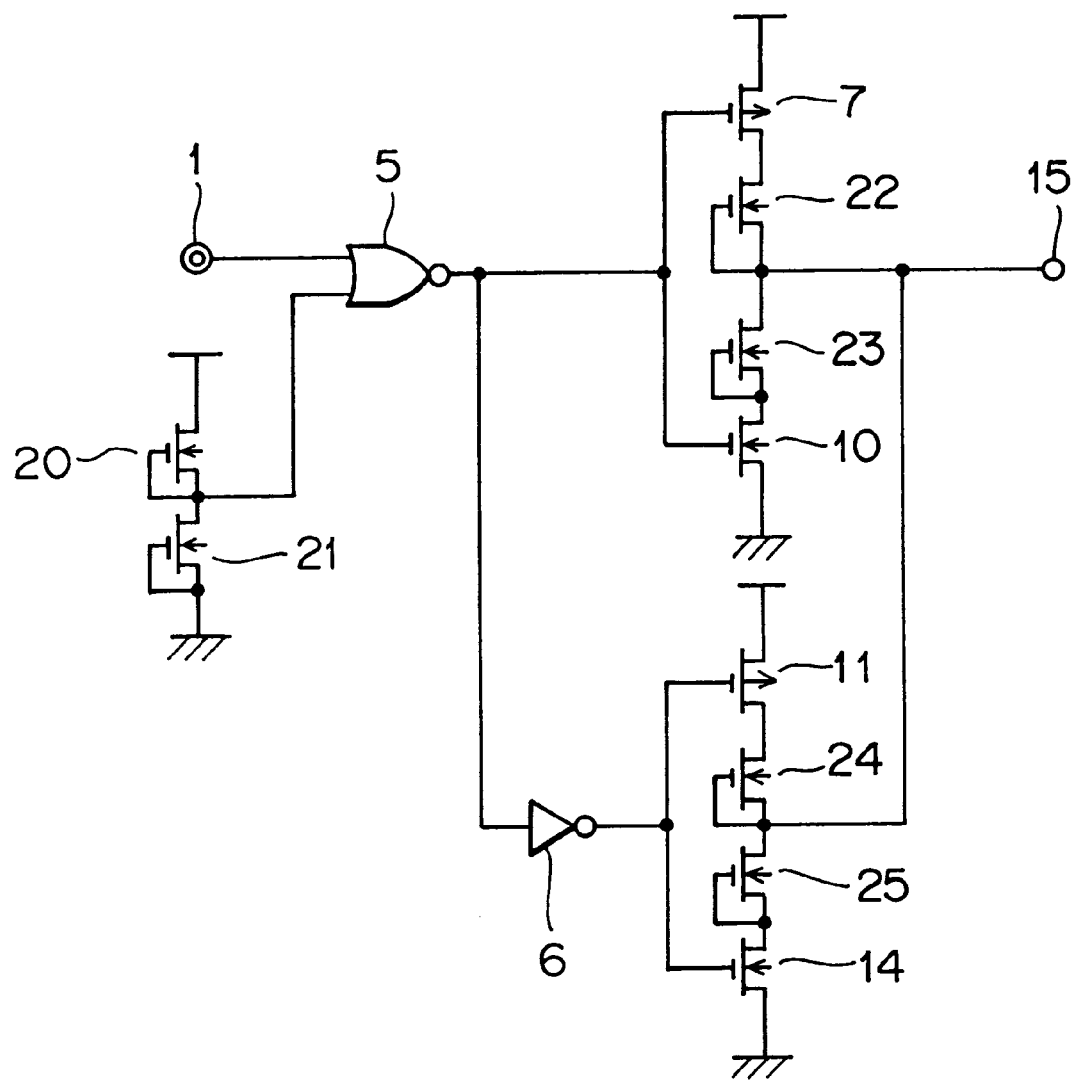
FIG. 7 is a circuit diagram showing an example in which each switch elements provided in the embodiment of the present invention shown in FIG.4 is composed of a N channel MOS transistor.

FIG. 7 is a circuit diagram showing an example in which the respective switch elements of the embodiment of the present invention are constituted of N-channel MOS transistors. In this case, the switch element 2 is composed of an N-channel MOS transistor 20 and the switch element 3 is composed of an N-channel MOS transistor 21. Further, the switch element 8 is composed of an N-channel MOS transistor 22 and the switch element 9 is composed of an N-channel MOS transistor 23. Furthermore, the switch element 12 is composed of an-N channel MOS transistor 24 and the switch element 13 is composed of an N-channel MOS transistor 25.

In a case when the switch elements are composed of transistors, the programmable buffer circuit of the present invention is preferable for application to, in particular, a mask ROM. Generally, in the mask ROM, each memory cell constituting the memory cell array is composed of a MOS transistor. Then, its threshold is determined depending on whether or not ion injection is to be carried out and a desired logical level is stored in each transistor. Thus, n a case when the switch element is composed of a transistor, it is possible to use the same transistor as in the memory cell transistor for each switch element. That is, if the switch elements 20–25 are formed at the same time when the transistors for the memory cell are formed and ion is injected into the switch elements 20–25 at the same time when ion injection to the transistors for the memory cell is carried out, formation of the switch elements and setting of the conductive state or the non-conductive state are achieved without increasing the production steps.

In a case when the switch element is composed of a transistor similar to the memory cell transistor and the present invention is applied to the mask ROM, the size of the transistor for the switch element is preferred to be larger than the size of the transistor for the memory cell. A channel width of the transistor for the memory cell is as small as, for example, 0.5 $\mu$m so that its current supply capacity is small. Thus, if the size of the switch element is substantially the same as the transistor for the memory cell, response of a signal to be transmitted to the internal CE terminal 15 is deteriorated. Thus, to prevent the deterioration of the response, it is desirable to set the channel width of the switch element to about 3 $\mu$m.

On the other hand, the channel width of the transistor constituting the NOR circuit 5, the transistor constituting the inverter circuit 6 and the transistors 7, 10, 11, and 14 constituting the first circuit 16 or the second circuit 17 is preferred to be set to about 5–10 $\mu$m.

As described above, it is desirable that the size of the transistor for the switch element is smaller than that of the other transistors in the programmable buffer circuit.

Therefore, it is understood that the advantage of the present invention which enables to design transistors excluding those for the switch elements with eight fewer transistors than the conventional art is very high in terms of actual semiconductor design.

Meanwhile, instead of the NOR circuit 5, a NAND circuit may be connected to the external CE terminal 1. In this case, the switch element to be made conductive changes depending on the customer's request. Table 2 below shows setting and the like of the switch elements when the NAND circuit is connected to the external CE terminal 1.

TABLE 2

| Customer's request | Sign of switch element to be made conductive | Input signal (terminal 1) | Output signal (terminal 15) |
| --- | --- | --- | --- |
| Low active | 2,8,9 | High | High |
| | | Low | Low |
| High active | 2,12,13 | High | Low |
| | | Low | High |
| Don't care | 3,8,9 | High | Low |
| | | Low | Low |

In the case when the NAND circuit is connected to the external CE terminal 1 also, it is possible to adapt the present invention to any user's request by only selecting the switch element even if the user's request is low active type, high active type or "don't care" type.

The signal to be supplied to the external terminal of the programmable buffer circuit according to the present invention is not restricted to the CE signal, but it may be a write enable signal, an output enable signal or the like. The present invention is also applicable to various kinds of control signals.

What is claimed is:

1. A programmable buffer circuit comprising:

a first input terminal;

a logical gate circuit having a second input terminal, a third input terminal and a first output terminal, said second input terminal being connected to said first input terminal;

a selective signal generating circuit for supplying two kinds of selective signals in logical level to said third input terminal;

a tri-state inverter circuit having a fourth input terminal and a second output terminal, said fourth input terminal being connected to said first output terminal;

a tri-state buffer circuit having a fifth input terminal and a third output terminal, said fifth input terminal being connected to said first output terminal; and a fourth output terminal connected to said second output terminal and said third output terminal;

wherein said tri-state buffer circuit further comprises:

an inverter circuit having a fifth output terminal, an input terminal of said inverter circuit being said fifth input terminal;

a first transistor;

a first switch element;

a second switch element;

a second transistor; and a couple of power supply terminals, said first transistor, said first switch element, said second switch element and said second transistor respectively being connected in series between said couple of power supply terminals, a gate of said first transistor and a gate of said second transistor being connected to an output terminal of said inverter circuit, and said third output terminal being connected to a connection point between said first switch element and said second switch element.

2. A programmable buffer circuit comprising:

a first input terminal;

a logical gate circuit having a second input terminal, a third input terminal and a first output terminal, said second input terminal being connected to said first input terminal;

a selective signal generating circuit for supplying two kinds of selective signals in logical level to said third input terminal;

a tri-state inverter circuit having a fourth input terminal and a second output terminal, said fourth input terminal being connected to said first output terminal;

a tri-state buffer circuit having a fifth input terminal and a third output terminal, said fifth input terminal being connected to said first output terminal; and a fourth output terminal connected to said second output terminal and said third output terminal;

wherein said tri-state inverter circuit comprises:
a first transistor;
a first switch element;
a second switch element;
a second transistor; and,
a couple of power supply terminals,
said first transistor, said first switch element, said second switch element and
said second transistor being respectively connected in series between said couple of power supply terminals, and said second output terminal being connected to a connection point between said first switch element and said second switch element;

wherein said first switch element and said second switch element are each composed of a MOS transistor in which a short circuit is established between a gate and a source, and wherein changeover between conductive state and nonconductive state of said first switch element and said second switch element is carried out by adjustment of a threshold of said MOS transistor.

3. A programmable buffer circuit according to claim 1, wherein said first switch element and said second switch element are each composed of a MOS transistor in which a short circuit is established between a gate and a source, and changeover between conductive state and non-conductive state of said first switch element and said second switch element is carried out by adjustment of a threshold of said MOS transistor.

4. A programmable buffer circuit comprising:

a first input terminal;

a logical gate circuit having a second input terminal, a third input terminal and a first output terminal, said second input terminal being connected to said first input terminal;

a selective signal generating circuit for supplying two kinds of selective signals in logical level to said third input terminal;

a tri-state inverter circuit having a fourth input terminal and a second output terminal, said fourth input terminal being connected to said first output terminal;

a tri-state buffer circuit having a fifth input terminal and a third output terminal, said fifth input terminal being connected to said first output terminal; and a fourth output terminal connected to said second output terminal and said third output terminal;

wherein said selective signal generating circuit comprises:
a first switch element;
a second switch element; and
a couple of power supply terminals,
said first switch element and said second switch element being connected in series between said couple of power supply terminals, and
a connection point between said first switch element and said second switch element being connected to said third input terminal;

wherein said first switch element and said second switch element are each composed of a MOS transistor in which a short circuit is established between a gate and a source, and wherein changeover between conductive state and nonconductive state of said first switch element and said second switch element is carried out by adjustment of a threshold of said MOS transistor.

5. A programmable buffer circuit comprising:

a first input terminal;

a logical gate circuit having a second input terminal, a third input terminal and a first output terminal, said second input terminal being connected to said first input terminal;

a selective signal generating circuit for supplying two kinds of selective signals in logical level to said third input terminal;

a tri-state inverter circuit having a fourth input terminal and a second output terminal, said fourth input terminal being connected to said first output terminal;

a tri-state buffer circuit having a fifth input terminal and a third output terminal, said fifth input terminal being connected to said first output terminal; and a fourth output terminal connected to said second output terminal and said third output terminal;

wherein said tri-state inverter circuit further comprises:
a first transistor;
a first switch element;
a second switch element;
a second transistor; and
a first couple of power supply terminals,
said first transistor, said first switch element, said second switch element and said second transistor being respectively connected in series between said first couple of power supply terminals, and
said second output terminal being connected to a connection point between said first switch element and said second switch element, wherein said tri-state buffer circuit further comprises:
an inverter circuit having a fifth output terminal, an input terminal of said inverter circuit being said fifth input terminal;
a third transistor;
a third switch element;
a fourth switch element;
a fourth transistor; and
a second couple of power supply terminals,
said third transistor, said third switch element, said fourth switch element and said fourth transistor being respectively connected in series between said second couple of power supply terminals, a gate of said third transistor and a gate of said fourth transistor being connected to said fifth output terminal, and said third output terminal being connected to a connection point between said third switch element and said fourth switch element, and wherein said selective signal generating circuit comprises:
a fifth switch element;
a sixth switch element; and
a third couple of power supply terminals,
said fifth switch element and said sixth switch element being connected in series between said third couple of power supply terminals, and
said third input terminal being connected to a connection point between said fifth switch element and said sixth switch element.

6. A programmable buffer circuit according to claim 5, wherein said first switch element, said second switch element, said third switch element, said fourth switch element, said fifth switch element and said sixth switch element are each composed of a MOS transistor in which a short circuit is established between a gate and a source, changeover between conductive state and non-conductive state of said first switch element, said second switch element, said third switch element, said fourth switch element, said fifth switch element and said sixth switch element is carried out by adjustment of a threshold of said MOS transistor.

7. A mask ROM device comprising:

a programmable buffer circuit; said programmable buffer circuit including:
a first input terminal;
a logical gate circuit having a second input terminal, a third input terminal and a first output terminal, said second input terminal being connected to said first input terminal;
a selective signal generating circuit for supplying two kinds of selective signals in logical level to said third input terminal;
a tri-state inverter circuit having a fourth input terminal and a second output terminal, said fourth input terminal being connected to said first output terminal;
a tri-state buffer circuit having a fifth input terminal and a third output terminal, said fifth input terminal being connected to said first output terminal; and
an internal terminal connected to said second output terminal and said third output terminal; and an internal circuit connected to said programmable buffer circuit, activated state or non-activated state of said internal circuit being changed over by the logical level of a signal to be transmitted to said internal terminal;

wherein said tri-state inverter circuit further comprises:
a first MOS transistor;
a second MOS transistor;
a third MOS transistor;
a fourth MOS transistor; and a first couple of power supply terminals,
said first MOS transistor, said second MOS transistor, said third MOS transistor and said fourth MOS transistor being respectively connected in series between said first couple of power supply terminals, and
said second output terminal being connected to a connection point between said second MOS Transistor and said third MOS transistor, wherein said tri-state buffer circuit further comprises:

an inverter circuit having a fifth output terminal, an input terminal of said inverter circuit being said fifth input terminal;
a fifth MOS transistor;
a sixth MOS transistor;
a seventh MOS transistor;
an eighth MOS transistor; and
a second couple of power supply terminals,
said fifth MOS transistor, said sixth MOS transistor, said seventh MOS transistor, and said eighth MOS transistor being respectively connected in series between said second couple of power supply terminals,
a gate of said fifth MOS transistor and a gate of said eighth MOS transistor being connected to said fifth output terminal, and
said third output terminal being connected to a connection point between said seventh MOS transistor and said eighth MOS transistor, and wherein said selective signal generating circuit comprises:
a ninth MOS transistor;
a tenth MOS transistor; and
a third couple of power supply terminal,
said ninth MOS transistor and said tenth MOS transistor being connected in series between said third couple of power supply terminals, and
a connection between said ninth MOS transistor and said tenth MOS transistor being connected to said third input terminal.

* * * * *